(12) United States Patent
Rouse et al.

(10) Patent No.: US 6,372,582 B1
(45) Date of Patent: Apr. 16, 2002

(54) INDIUM RETROGRADE CHANNEL DOPING FOR IMPROVED GATE OXIDE RELIABILITY

(75) Inventors: Richard P. Rouse, San Francisco; Ming Yin Hao, Sunnyvale; Emi Ishida, Sunnyvale; Effiong Ibok, Sunnyvale, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/639,794

(22) Filed: Aug. 17, 2000

Related U.S. Application Data
(60) Provisional application No. 60/149,436, filed on Aug. 18, 1999.

(51) Int. Cl.$^7$ ............................................. H01L 21/336
(52) U.S. Cl. ...................................... 438/289; 438/522
(58) Field of Search ................................. 438/289, 522

(56) References Cited

U.S. PATENT DOCUMENTS

| | | | |
|---|---|---|---|
| 4,000,504 A | 12/1976 | Berger | |
| 5,547,882 A | 8/1996 | Juang et al. | |
| 5,654,210 A | * 8/1997 | Aronowitz et al. | ......... 438/526 |
| 5,726,488 A | 3/1998 | Watanabe | |
| 5,767,557 A | * 6/1998 | Kizilyalli | ..................... 257/403 |

\* cited by examiner

*Primary Examiner*—Charles Bowers
*Assistant Examiner*—William C. Vesperman

(57) ABSTRACT

Submicron-dimensioned, silicon-based MOS-type transistor devices having reduced tendency for "latch up" are formed by removing residual indium dopant utilized for forming a retrograde-shaped indium doping concentration profile of the channel region from the surface and uppermost stratum of the silicon substrate by a rapid thermal annealing process prior to silicon oxide thin gate insulator formation. The inventive methodology substantially eliminates deleterious indium contamination of the gate insulator layer.

13 Claims, 2 Drawing Sheets

INDIUM RETROGRADE CHANNEL DOPING FOR IMPROVED GATE OXIDE RELIABILITY

RELATED APPLICATIONS

This application claims priority from Provisional Application Serial No. 60/149,436 filed on Aug. 18, 1999 entitled: "INDIUM RETROGRADE CHANNEL DOPING FOR IMPROVED GATE OXIDE RELIABILITY", the entire disclosure of which is hereby incorporated by reference therein.

CROSS-REFERENCE TO RELATED APPLICATION

This application contains subject matter related to subject matter disclosed in co-pending application Ser. No. 09/376,532, filed Aug. 18, 1999.

FIELD OF THE INVENTION

The present invention relates to a method of forming indium-doped channel regions in a semiconductor substrate, whereby a desired retrograde-shaped indium concentration distribution profile is obtained. The present invention has particular utility in the manufacture of MOS-type transistor devices and semiconductor integrated circuits with improved processing methodology resulting in increased device reliability and performance characteristics. The present invention is also useful in the manufacture of CMOS devices and has particular applicability in fabricating high-density integration semiconductor devices with design features below about 0.18 $\mu$m, e.g., about 0.15 $\mu$m.

BACKGROUND OF THE INVENTION

The escalating requirements for high density and performance associated with ultra-large scale integration (ULSI) semiconductor devices, such as are currently manufactured or contemplated, require design features of 0.18 $\mu$m and below, such as 0.15 $\mu$m and below, increased transistor and circuit speeds, high reliability, and increased manufacturing throughput for economic competitiveness. The reduction of design features to 0.18 $\mu$m and below challenges the limitations of conventional semiconductor manufacturing techniques.

As feature sizes of MOS and CMOS devices have decreased to the sub-micron range, so-called "short-channel" effects have arisen which tend to limit device performance. For n-channel MOS transistors, the major limitation encountered is caused by hot-electron-induced instabilities. This problem occurs due to high electrical fields between the source and the drain, particularly near the drain, such that charge carriers, either electrons or holes, are injected into the gate or semiconductor substrate. Injection of hot carriers into the gate can cause gate oxide charging and threshold voltage instabilities which accumulate over time and greatly degrade device performance. In order to counter and thus reduce such instabilities, shallow junction, lightly- or moderately-doped source/drain extension type transistor structures have been developed.

For p-channel transistors, the major "short-channel" effect which limits device performance arises from "punch-through" effects which occur with relatively deep junctions. In such instances, there is a wider sub-surface depletion effect and it is easier for the field lines to go from the drain to the source, resulting in the above-mentioned "punch-through" current problems and device shorting. To minimize this effect, relatively shallow junctions are employed in forming p-channel MOS-type transistors.

The most satisfactory solution to date of hot carrier instability problems of MOS and CMOS-type sub-micron-dimensioned devices is the provision of lightly- or moderately-doped source/drain extensions driven just under the gate region, while the heavily-doped source/drain regions are laterally displaced away from the gate by the use of a pair of spacers on opposite sidewalls of the gate. Such structures are particularly advantageous because they do not have problems with large lateral diffusion and the channel length can be set precisely.

In operation of such devices, an input voltage is applied to the gate electrode and an output voltage is developed across the source and drain terminals. When the input voltage is applied to the gate electrode, a transverse electrical field is set up in the channel region between the source and drain regions. Variation of the transverse electrical field makes it possible to vary the conductance of the channel region, whereby an electric field controls the flow of current through the channel region between the source and drain regions. The channel region typically is lightly doped with an impurity of conductivity type opposite that of the source/drain regions, and the dopant impurity concentration distribution profile is typically uniform in the direction extending downwardly from the substrate surface. Such type MOS structures, however, are susceptible to "latch up", wherein a very low resistance path is established between the $V_{SS}$ and $V_{DD}$ power lines, resulting in excessive current flow across the power supply terminals. Susceptibility to "latch-up" arises from the presence of complementary parasitic bipolar transistor structures, and is particular problematic with CMOS devices because such bipolar structires can electrically interact, in the manner of a pnpn diode. In the absence of triggering currents, such diodes act as reverse-biased junctions and do not conduct. However, it is possible for triggering currents to be established in a variety of ways during abnormal circuit operating conditions. Since many such parasitic pnpn structures can be present within a single chip, it is possible to trigger any one of them into a "latch up" condition and thus cause cessation of proper device functioning or even destroy the device due to locally high power dissipation.

One approach for control or elimination of "latch up" is the provision of retrograde doping profiles, i.e., a dopant impurity concentration distribution profile exhibiting a concentration peak deep below the substrate surface. Retrograde Channel Profiles ("RCP") are employed in MOS and CMOS technology to reduce threshold voltage ($V_T$) roll-off, i.e., sudden decrease of $V_T$ at very small ("sub-nominal") device lengths. However, for RCP to be effective, the profile itself should meet certain criteria. First, the peak concentration should be located at an optimal depth from the surface because, on the one hand, if the impurity concentration peak is formed too close to the substrate surface, $V_T$ must be increased, while on the other hand, if the impurity concentration peak is too far below the substrate surface, the tendency for "latch up" will not be reduced or eliminated. Second, the profile along a vertical cut should be rather sharp, e.g., a delta function.

The use of boron doping (i.e., p-type doping) techniques for forming such RCP structures in the case of n-channel MOS and CMOS devices is problematic, principally due to the ease with which boron atoms diffuse in silicon semiconductor substrates. The rapidity of boron dopant atom diffusion upon thermal treatment for post-implantation activation/lattice damage relaxation disadvantageously results in a relatively flat or broadly-peaked concentration distribution profile rather than the desired sharply peaked profile.

The use of indium as an alternative p-type dopant to boron for RCP formation incurs a drawback in that indium easily diffuses into silicon oxide (e.g., $SiO_2$) gate insulator layers, resulting in degradation of the gate oxide reliability. RCP formation with satisfactorily sharply-peaked profiles utilizing indium as a p-type dopant for channel regions of silicon-based MOS and CMOS transistor devices can be effected by implanting indium-containing ions In+ into a portion of the surface 2 of a silicon substrate 1 where a channel region is to be later formed at dosages and energies typically in the ranges of $1 \times 10^{12}$–$8 \times 10^{13}$ ions/cm$^2$ and 80–140 KeV, respectively, as illustrated by curve 3 of FIG. 1(A). As is evident from the figure, indium implantation under such conditions results in a retrograde-shaped doping concentration profile extending to a depth $d_1$ below substrate surface 2, with a maximum (or peak) indium concentration $c_{max}$ at a depth $d_{max}$. However, as is apparent from FIG. 1(B), which illustrates the state after thin gate insulator layer 6 formation on surface 2, indium atoms and/or ions 4 remaining on the substrate surface and/or implanted in the uppermost stratum 5 of the substrate, rapidly diffuse into and degrade the reliability and insulative properties of the thin gate insulator layer 6 when the latter is of a silicon oxide thermally grown or otherwise formed on the substrate surface 2, or when the latter is subjected to subsequent device formation processing at elevated temperatures conducive to dopant diffusion. Residual, post-implantation indium present on the substrate surface 2 is extremely difficult to remove by conventional chemical-based methodologies, e.g., etching, without incurring undesirable surface damage. Moreover, existing etching methods are unable to substantially completely remove implanted indium ions and/or atoms from a sufficiently deep upper stratum of substrate 1 as to effectively preclude diffusion of indium into the subsequently formed thin gate oxide layer 6.

Thus, a need exists for improved semiconductor manufacturing methodology for fabricating MOS and CMOS transistors and related devices which does not suffer from the above-described drawbacks associated with the rapid diffusion of indium in silicon oxide-based thin gate insulator layers and the difficulty of removal of residual indium ions and/or atoms from implanted substrate surfaces by conventional chemical techniques. Moreover there exists a need for an improved process for fabricating MOS transistor-based devices with reduced short-channel effects such as "latch up", which process is fully compatible with conventional process flow and provides increased manufacturing throughput and product yield.

DISCLOSURE OF THE INVENTION

An advantage of the present invention is an improved method for forming an indium-doped retrograde-shaped doping profile in a semiconductor substrate, having a preselected maximum or peak indium concentration at a preselected depth below the surface of the substrate and a substantially indium-free stratum extending for a preselected depth below the substrate surface.

Another advantage of the present invention is an improved method for forming a MOS or CMOS semiconductor device comprising a semiconductor substrate having an indium-doped retrograde-shaped channel doping profile and an overlying thin gate insulator layer substantially free of diffused indium.

Yet another advantage of the present invention is a silicon-based, MOS-type transistor device having a channel region comprising an indium-doped retrograde-shaped doping profile and a silicon oxide thin gate insulator layer substantially free of diffused indium ions and/or atoms.

Additional advantages and other features of the present invention will be set forth in the description which follows and in part will become apparent to those having ordinary skill in the art upon examination of the following or may be learned from the practice of the instant invention. The advantages of the present invention may be realized and obtained as particularly pointed out in the appended claims.

According to an aspect of the present invention, the foregoing and other advantages are achieved in part by a method of forming an indium-doped semiconductor having a retrograde-shaped indium doping concentration profile, which method comprises the sequential steps of:

(a) providing a semiconductor substrate having a surface;

(b) introducing indium-containing dopant atoms and/or ions into a portion of the surface to form a retrograde-shaped indium doping concentration profile extending from the surface to a first depth below the surface; and (c) removing substantially all of the introduced indium dopant from the surface and from a stratum of the substrate extending from the surface down to a second depth less than the first depth.

In embodiments according to the present invention, step (a) comprises providing a silicon substrate; step (b) comprises forming a retrograde-shaped indium doping concentration profile having a preselected first depth and a maximum indium concentration at a preselected depth by implanting indium-containing ions at a dosage of from about $1 \times 10^{12}$ to about $8 \times 10^{13}$ ions/cm$^2$ at an energy of from about 80 to about 140 KeV; step (c) comprises removing substantially all of the indium dopant ions and/or atoms from the surface and from a stratum extending from the surface to a preselected depth by rapid thermal annealing (RTA) at a temperature of about 1,000–1,050° C. for about 10–20 seconds; and further comprising the steps of: (d) providing a layer stack comprising a substantially indium-free, thin silicon oxide gate insulator layer and an electrically conductive gate electrode layer successively formed over the portion of the surface; and (e) forming a pair of source/drain regions in the substrate adjacent opposite lateral sides of the layer stack.

According to another aspect of the present invention, a method of manufacturing a MOS transistor device having a channel region comprising a retrograde-shaped indium doping concentration profile is provided, which method comprises the sequential steps of:

(a) providing a silicon semiconductor substrate having a surface;

(b) implanting indium-containing dopant ions into a portion of the surface to form a retrograde-shaped indium doping concentration profile extending from the surface to a first depth;

(c) rapid thermal annealing the substrate to remove substantially all of the implanted indium ions and/or atoms from the surface and from a stratum of the substrate extending from the surface to a second depth less than the first depth;

(d) successively forming a substantially indium-free, thin silicon oxide gate insulator layer and a heavily-doped polysilicon gate electrode layer over the portion of the surface;

(e) forming a pair of source/drain regions in the substrate at laterally opposed ends of the surface portion; and (f) forming ohmic contacts to the gate electrode layer and the pair of source/drain regions.

According to embodiments of the present invention, step (b) comprises forming a retrograde-shaped indium doping concentration profile extending to a preselected first depth and a maximum indium concentration at a preselected depth by implanting indium-containing ions at a dosage of from about $1 \times 10^{12}$ to about $8 \times 10^{13}$ ions/cm$^2$ at an energy of from about 80 to about 140 KeV; step (c) comprises removing substantially all of the implanted dopant ions from the surface and from a stratum extending from the surface to the preselected second depth by rapid thermal annealing the substrate at a temperature of about 1,000–1,050° C. for about 10–20 seconds; step (d) comprises forming a silicon oxide thin gate insulator layer about 25–50 Å thick; and step (f) comprises forming refractory metal silicide ohmic contacts to the gate electrode layer and the pair of source/drain regions.

According to yet another aspect according to the present invention, a semiconductor body is provided, comprising:

a silicon semiconductor substrate having an indium-free surface;

a first, substantially indium-free stratum formed beneath a portion of the substrate surface and extending to a first depth; and a second, indium-doped stratum beneath the first stratum, the second stratum comprising a retrograde-shaped indium doping concentration profile extending from the first depth to a second depth and having a maximum indium concentration at a third depth intermediate the first and second depths.

According to still another aspect of the present invention, an MOS transistor device comprising the above semiconductor body having a retrograde-shaped indium doping concentration profile is provided, comprising:

a layer stack formed on the portion on the portion of the surface of the semiconductor substrate, the layer stack comprising:
  i. a substantially indium-free, thin gate insulator layer in contact with the portion of the surface; and
  ii. an electrically conductive gate electrode layer on the gate insulator layer, a channel region in the substrate below and contiguous with the layer stack, the channel region comprising:
  i. the first, substantially indium-free stratum; and
  ii. the second, indium-doped stratum having the retrograde-shaped indium doping concentration profile beneath the first stratum;

a pair of source/drain junction regions formed in the substrate at laterally opposed ends of the channel region; and ohmic contacts to each of the gate electrode layer and source/drain regions.

According to embodiments of the present invention, the semiconductor substrate comprises a monocrystalline silicon wafer; the thin gate insulator layer comprises a silicon oxide layer about 25–50 Å thick; the gate electrode layer comprises heavily-doped polysilicon; and each of the ohmic contacts comprises an electrically conductive refractory metal silicide.

Additional advantages and aspects of the present invention will become readily apparent to those skilled in the art from the following detailed description, wherein only the preferred embodiment of the present invention is shown and described, simply by way of illustration of the best mode contemplated for carrying out the method of the present invention. As will become evident, the present invention is capable of other and different embodiments, and its several details are susceptible of modification in various obvious respects, all without departing from the spirit of the present invention. Accordingly, the drawing and description are to be regarded as illustrative in nature, and not as limitative.

BRIEF DESCRIPTION OF THE DRAWINGS

The following detailed description of the embodiments of the present invention can best be understood when read in conjunction with the following drawings, wherein like reference numerals are employed throughout for designating like features and/or components of the invention, in which.

DESCRIPTION OF THE INVENTION

The present invention addresses and solves problems arising from deleterious diffusion of indium dopant ions and/or atoms from the channel region of a transistor into the overlying gate insulator layer, particularly during the manufacture of submicron-dimensioned silicon-based MOS- and CMOS-type transistors, by removing residual indium ions and/or atoms from the surface of an indium-implanted semiconductor substrate and from the uppermost stratum thereof extending down into the substrate for a preselected depth, prior to gate insulator formation thereon. Advantageously, the method is fully compatible with all other aspects of existing processing methodology for the manufacture of such devices.

Briefly stated, according to the present invention, a method of manufacturing MOS and CMOS transistors, as well as other types of semiconductor devices, is provided, wherein a portion of the surface of a semiconductor substrate where a channel region is to be formed is implanted with indium-containing ions at a dosage and energy optimized for forming a retrograde-shaped indium doping concentration profile extending for a first preselected depth into the substrate and having a maximum (or peak) indium concentration at a second preselected depth. Following implantation, and prior to thin gate insulator formation on the implanted surface portion, the substrate is subjected to a non-chemical treatment, as by rapid thermal annealing, for removing substantially all residual indium ions and/or atoms from the surface and for a third preselected depth below the surface. A thin gate insulator layer, typically of a silicon oxide, is then formed thereon substantially free of deleterious indium impurities and is not subject to indium contamination via diffusion from the underlying substrate during subsequent device processing at elevated temperatures.

Figure 2A:
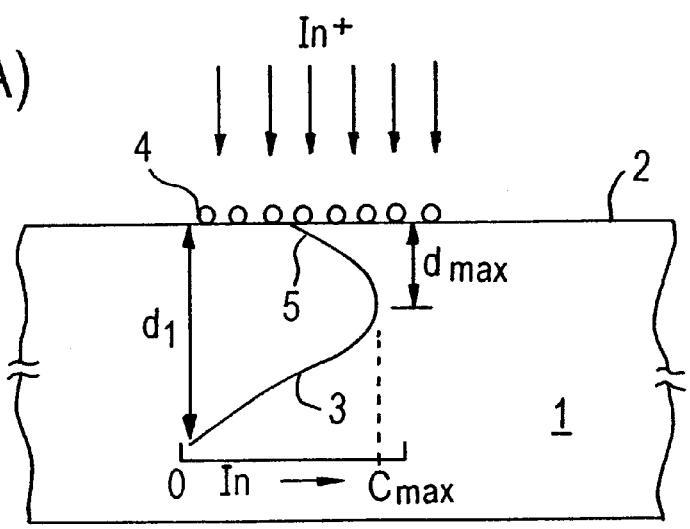
FIGS. 2(A)–2(C) illustrate, in simplified cross-sectional schematic form, a sequence of processing steps for providing a semiconductor with an improved retrograde-shaped indium doping concentration profile and an overlying substantially indium-free, thin gate insulator layer, according to the inventive methodology.
Figure 2B:
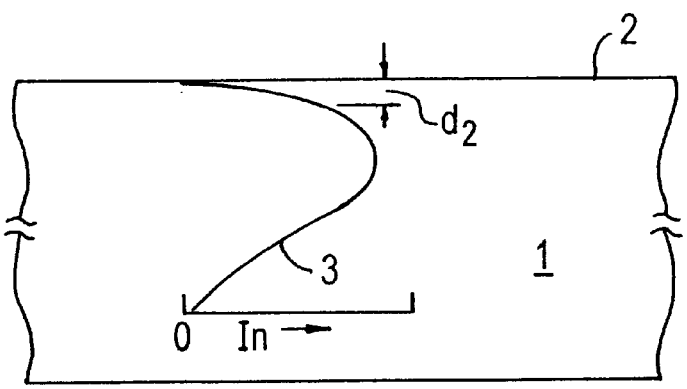
Figure 2C:
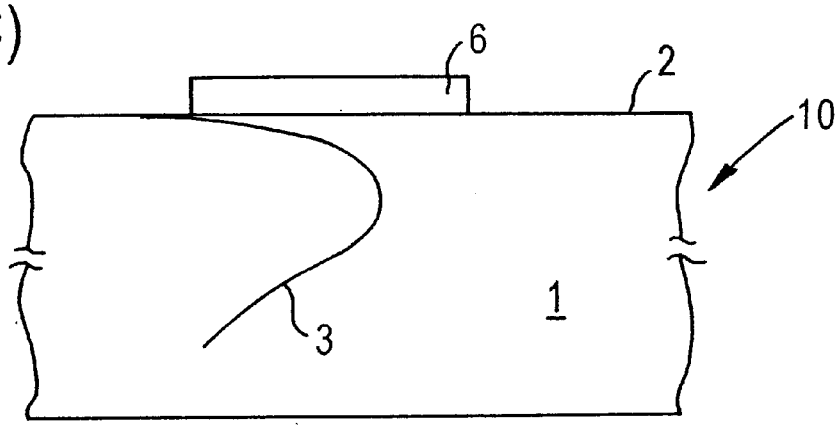

Referring now to FIGS. 2(A)–2(C), shown therein is a sequence of process steps for performing an illustrative, but not limitative, MOS-based embodiment of the present invention. As will be apparent, the inventive process may be readily adapted for use in manufacturing CMOS transistors and similar semiconductor devices. It should also be recognized that the process steps and structures described below do not necessarily form a complete process flow for manufacturing MOS or CMOS transistors for use in integrated circuits. However, the present invention can be practiced in conjunction with conventional integrated circuit fabrication techniques and methodologies currently employed in the art, and only so much of the commonly practiced process steps are included here as are necessary for an understanding of the present invention. As used throughout the present disclosure and claims, the term "substrate" denotes a semiconductor substrate per se or an epitaxial semiconductor layer formed on a suitable semiconductor substrate. Finally, the figures representing cross-sections of portions of semiconductor devices during fabrication processing are not drawn to scale, but instead are drawn as to best illustrate the features of the present invention.

Figure 1A:
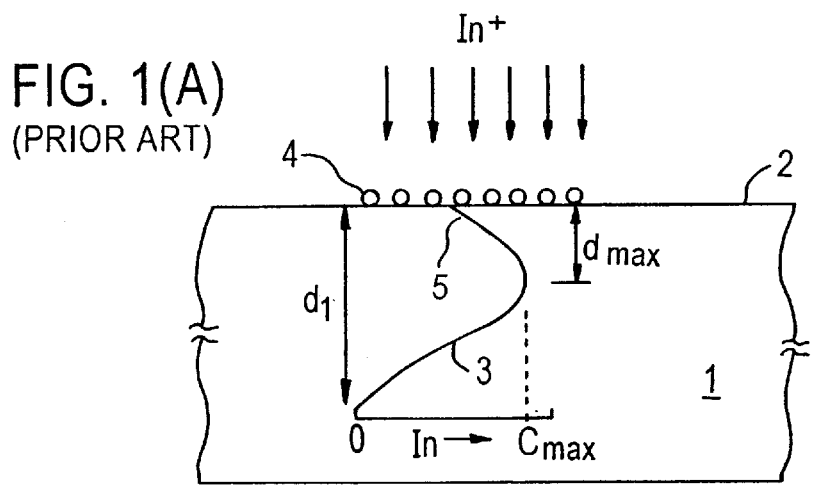
FIGS. 1(A)–1(B) illustrate, in simplified cross-sectional schematic form, a sequence of processing steps for forming a retrograde-shaped indium doping concentration profile in a semiconductor substrate, according to the conventional art.
Figure 1B:
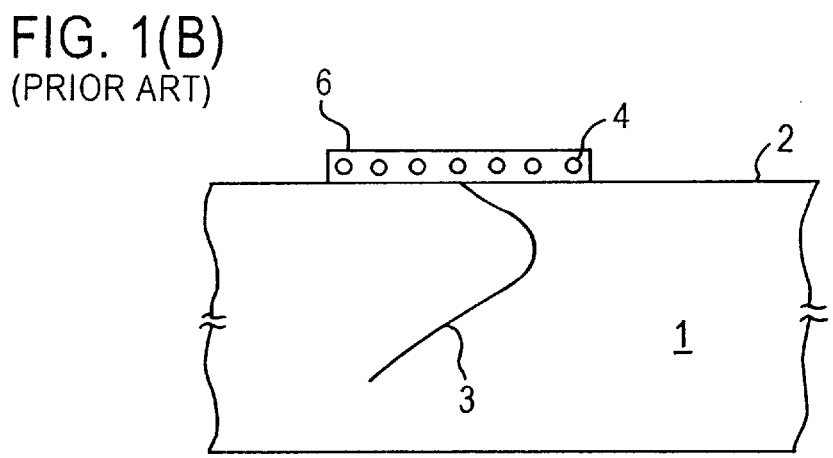

Referring now to FIG. 2(A), which is identical in all respects to FIG. 1(A), in a first step according to the inventive method, indium ions $In^+$ are implanted into a portion of the surface 2 of a semiconductor substrate 1, typically a monocrystalline silicon wafer, to form a retrograde-shaped indium doping concentration profile 3. The conditions for implantation are as employed in the conventional methodology described above with respect to FIG. 1(A), i.e., dosages and energies are typically in the ranges of $1\times10^{12}-8\times10^{13}$ ions/cm$^2$ and 80–140 KeV, respectively. Under these implantation conditions, a sharp maximum (or peak) indium concentration $c_{max}$ occurs at a depth $d_{max}$ below substrate surface 2 and the indium concentration is substantially 0 at a depth $d_1$. Adverting to FIG. 2(B), in the next step according to the invention, the indium-implanted substrate 1 is subjected to rapid thermal annealing (RTA) at a temperature of about 1,000–1,050° C. for about 10–20 seconds, for driving off residual indium ions and/or atoms from the surface 2 of the substrate 1 and for promoting out-diffusion of indium dopant from the uppermost stratum thereof, whereby substantially all of the indium dopant ions and/or atoms are removed from surface 2 within a stratum extending for a depth $d_2$ beneath surface 2. Such thermally implemented, non-chemical removal of residual indium from surface 2 as well as for depth $d_2$ beneath the surface advantageously incurs little or no damage to the substrate surface and promotes post-implantation lattice damage relaxation.

Referring now to FIG. 2(C), following RTA, a thin gate insulator layer 6, typically a silicon oxide layer about 25–50 Å thick, is formed on surface 2 of the indium-implanted substrate 1, as by conventional methodologies, e.g., thermal oxidation, chemical vapor deposition (CVD), plasma enhanced chemical vapor deposition (PECVD), or physical vapor deposition (PVD). Since surface 2 and the upper stratum (of thickness $d_2$) of substrate 1 are substantially indium-free, thin gate insulator layer 6 is formed indium-free and remains substantially indium-free during subsequent device processing at elevated temperatures which would otherwise result in contamination thereof by out-diffusion of indium from the uppermost stratum of substrate 1.

The resultant structure 10 shown in FIG. 2(C) comprising a semiconductor substrate 1 having a portion thereof with a retrograde-shaped indium doping concentration profile 3 and an overlying, substantially indium-free thin insulator layer 4 is, according to an embodiment of the present invention, utilized as a precursor for the, manufacture of submicron-dimensioned MOS-type transistor devices by further processing, in conventional manner not described here in detail order not to unnecessarily obscure the present invention, which devices advantageously exhibit a significant and substantially reduced tendency for "latch up" due to the presence of the retrograde-shaped indium doping concentration profile 3 in the channel region beneath the gate insulator layer 4 between source and drain regions.

Figure 3:
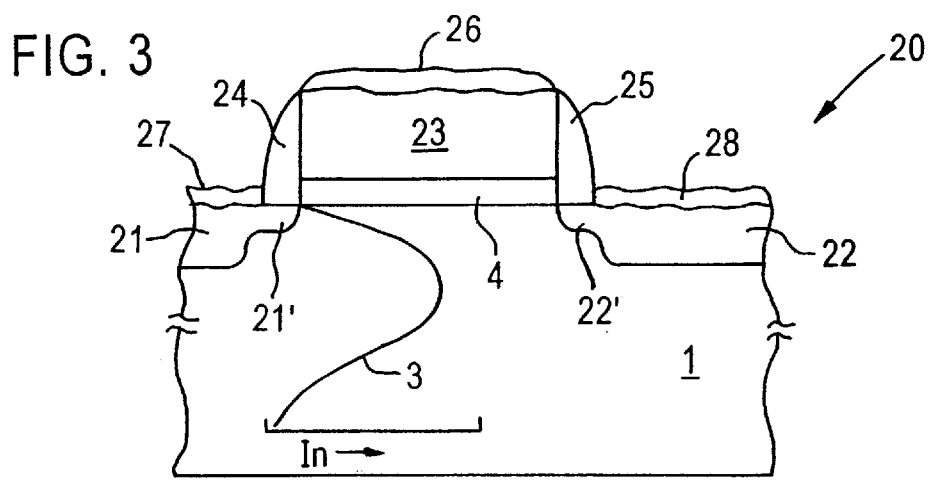
FIG. 3 illustrates, in simplified, cross-sectional schematic form, a MOS transistor comprising a channel region having a retrograde-shaped indium doping concentration profile formed according to the present invention.

An illustrative, but non-limitative example of such device 20 obtained by further processing of precursor structure 10 by conventional techniques is shown in FIG. 3, wherein reference numerals 21, 22 indicate source/drain junction regions having respective lightly-doped extensions 21', 22'; 4 and 23, respectively, represent a silicon oxide thin gate insulator layer about 25–50 Å thick and an overlying heavily-doped polysilicon gate electrode layer 23; 24 and 25 represent insulative sidewall spacers formed on opposing side edges of the gate oxide/gate electrode layer stack, and typically comprised of a silicon oxide, nitride, or oxynitride; and 26–28 represent refractory metal silicide ohmic contacts to the gate electrode layer 23 and source/drain regions 21, 22, respectively. The channel region beneath substantially indium-free gate insulator layer 4 advantageously comprises retrograde-shaped indium doping concentration profile 3 contributing to a significant and substantial reduction or elimination of the tendency for "latch up".

The present invention thus enables formation of reliable, submicron-dimensioned MOS and/or CMOS transistor devices having little or substantially no tendency for "latch up" by virtue of the provision of a retrograde-shaped indium doping concentration profile in the channel region between source and drain regions, and can be fabricated at manufacturing rates consistent with throughput requirements for economic competitiveness. Moreover, the inventive methodology is fully compatible with conventional process flow for automated manufacture of high-density integration semiconductor devices.

In the previous description, numerous specific details are set forth, such as specific materials, structures, reactants, processes, etc., in order to provide a better understanding of the present invention. However, the present invention can be practiced without resorting to the details specifically set forth. In other instances, well-known processing materials and techniques have not been described in order not to unnecessarily obscure the present invention.

Only the preferred embodiment of the present invention and but a few examples of its utility and versatility are shown and described in the present disclosure. It is to be understood that the present invention is capable of use in various other combinations and environments and is susceptible of changes and/or modifications within the scope of the inventive concept as expressed herein.

What is claimed is:
1. A method of forming an indium-doped semiconductor having a retrograde-shaped indium doping concentration profile, which method comprises the sequential steps of:
   (a) providing a semiconductor substrate having a surface;
   (b) introducing indium-containing dopant atoms and/or ions into a portion of said surface to form a retrograde-shaped indium doping concentration profile extending from said surface to a first depth; and
   (c) removing substantially all of said introduced indium dopant atoms from said surface and from a stratum of said substrate extending from said surface down to a second depth less than said first depth.

2. The method as in claim 1, wherein step (a) comprises providing a silicon wafer substrate.

3. The method as in claim 2, wherein step (b) comprises forming a retrograde-shaped indium doping profile extending to said first depth and having a maximum indium concentration $c_{max}$ at a preselected depth $d_{max}$.

4. The method as in claim 3, wherein step (b) comprises implanting indium-containing ions at a dosage of from about $1 \times 10^{12}$ to about $8 \times 10^{13}$ ions/cm$^2$ at an energy of from about 80 to about 140 KeV.

5. The method as in claim 3, wherein step (c) comprises removing substantially all of said indium dopant ions and/or atoms from said surface and from a stratum extending from said surface to a preselected depth.

6. The method as in claim 5, wherein step (c) comprises rapid thermal annealing (RTA) at a temperature of about 1,000–1,050° C. for about 10–20 seconds.

7. The method as in claim 2, further comprising the steps of:
- (d) providing a layer stack comprising a substantially indium-free, thin silicon oxide gate insulator layer and electrically conductive gate electrode layer successively formed over said portion of said substrate surface; and
- (e) forming a pair of source/drain regions in said substrate adjacent opposite lateral sides of said layer stack.

8. A method of manufacturing a MOS transistor device having a channel region comprising a retrograde-shaped indium doping profile, which method comprises the sequential steps of:
- (a) providing a silicon semiconductor substrate having a surface;
- (b) implanting indium-containing dopant ions into a portion of said surface to form a retrograde-shaped indium doping concentration profile extending from said surface to a first depth;
- (c) rapid thermal annealing said substrate to remove substantially all of the implanted indium ions and/or atoms from said surface and from a stratum extending from said surface to a second depth less than the first depth;
- (d) successively forming a substantially indium-free, thin silicon oxide gate insulator layer and a heavily-doped polysilicon gate electrode layer over said portion of said substrate surface;
- (e) forming a pair of source/drain junction regions in said substrate at laterally opposed ends of said surface portion; and
- (f) forming ohmic contacts to said gate electrode layer and said pair of source/drain regions.

9. The method as in claim 8, wherein step (b) comprises forming a retrograde-shaped indium doping concentration profile extending to said first depth and having a maximum indium concentration $c_{max}$ at a depth $d_{max}$.

10. The method as in claim 9, wherein step (b) comprises implanting indium-containing ions at a dosage of from about $1 \times 10^{12}$ to about $8 \times 10^{13}$ ions/cm$^2$ at an energy of from about 80 to about 140 KeV.

11. The method as in claim 10, wherein step (c) comprises removing substantially all of said implanted indium dopant ions from said surface and from a stratum extending from said surface to said second preselected depth.

12. The method as in claim 11, wherein step (c) comprises rapid thermal annealing said substrate at a temperature of about 1,000–1,050° C. for about 10–20 seconds.

13. The method as in claim 12, wherein step (d) comprises forming a silicon oxide thin gate insulator layer about 25–50 Å thick and step (f) comprises forming refractory metal silicide ohmic contacts to said gate electrode layer and said pair of source/drain regions.

* * * * *